(12) United States Patent
Kim

(10) Patent No.: US 7,297,630 B2
(45) Date of Patent: Nov. 20, 2007

(54) METHODS OF FABRICATING VIA HOLE AND TRENCH

(75) Inventor: Jung Joo Kim, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 342 days.

(21) Appl. No.: 11/027,435

(22) Filed: Dec. 30, 2004

(65) Prior Publication Data

US 2005/0142865 A1 Jun. 30, 2005

(30) Foreign Application Priority Data

Dec. 31, 2003 (KR) .................... 10-2003-0101500

(51) Int. Cl.
H01L 21/00 (2006.01)
H01L 21/335 (2006.01)
H01L 21/331 (2006.01)
H01L 21/76 (2006.01)
H01L 21/4763 (2006.01)
H01L 21/44 (2006.01)
H01L 29/40 (2006.01)

(52) U.S. Cl. .................. 438/648; 438/58; 438/143; 438/310; 438/402; 438/417; 438/622; 438/623; 438/624; 438/625; 438/656; 438/672; 438/675; 438/683; 438/685; 438/687; 257/758; 257/759; 257/760; 257/761

(58) Field of Classification Search .............. None
See application file for complete search history.

(56) References Cited

U.S. PATENT DOCUMENTS

| 5,953,615 | A | 9/1999 | Yu |
| 6,015,747 | A | 1/2000 | Lopatin et al. |
| 6,069,068 | A | 5/2000 | Rathore et al. |
| 6,130,161 | A | 10/2000 | Ashley et al. |
| 6,180,523 | B1 | 1/2001 | Lee et al. |
| 6,194,279 | B1 | 2/2001 | Chen et al. |
| 6,235,633 | B1 | 5/2001 | Jang |
| 6,258,710 | B1 | 7/2001 | Rathore et al. |

(Continued)

FOREIGN PATENT DOCUMENTS

JP 4-127454 4/1992

(Continued)

OTHER PUBLICATIONS

Jung Joo Kim; Method of Fabricating Semiconductor Device; U.S. Appl. No. 11/027,839, filed Dec. 29, 2004; 18 Pages and 2 Drawing Sheets; Assignee; Donghu Anam Semiconductor Inc.

(Continued)

Primary Examiner—Michael Lebentritt
Assistant Examiner—James M Mitchell
(74) Attorney, Agent, or Firm—Andrew D. Fortney

(57) ABSTRACT

A method of fabricating a via and a trench is disclosed. A disclosed method comprises: forming a via hole and a trench in a interlayer dielectric layer on a semiconductor substrate where a predetermined device is formed; depositing a thin Hf layer on the substrate; performing a thermal treatment of the substrate to getter oxygen and forming a barrier layer; and filling copper into the via hole and the trench.

18 Claims, 3 Drawing Sheets

U.S. PATENT DOCUMENTS

| | | |
|---|---|---|
| 6,287,954 B1 | 9/2001 | Ashley et al. |
| 6,331,485 B1 | 12/2001 | Miyamoto |
| 6,348,731 B1 | 2/2002 | Ashley et al. |
| 6,461,914 B1 | 10/2002 | Roberts et al. |
| 6,476,454 B2 | 11/2002 | Suguro |
| 6,583,021 B2 | 6/2003 | Song |
| 6,607,958 B2 | 8/2003 | Suguro |
| 6,750,541 B2 | 6/2004 | Ohtsuka et al. |
| 6,764,899 B2 | 7/2004 | Yoon |
| 6,838,352 B1 | 1/2005 | Zhao |
| 6,849,927 B2 * | 2/2005 | Farrar ............ 257/643 |
| 6,869,871 B1 * | 3/2005 | Choi ............ 438/622 |
| 6,949,461 B2 | 9/2005 | Malhotra et al. |
| 6,992,005 B2 | 1/2006 | Ohtsuka et al. |
| 2001/0025999 A1 | 10/2001 | Suguro |
| 2002/0006725 A1* | 1/2002 | Farrar ............ 438/687 |
| 2002/0048931 A1* | 4/2002 | Farrar ............ 438/622 |
| 2002/0158338 A1 | 10/2002 | Ohtsuka et al. |
| 2002/0197844 A1 | 12/2002 | Johnson et al. |
| 2003/0011043 A1 | 1/2003 | Roberts |
| 2003/0027393 A1 | 2/2003 | Suguro |
| 2003/0096467 A1 | 5/2003 | Park et al. |
| 2004/0087135 A1 | 5/2004 | Canaperi et al. |
| 2004/0188839 A1 | 9/2004 | Ohtsuka et al. |

FOREIGN PATENT DOCUMENTS

| | | |
|---|---|---|
| JP | 2001-274380 | 10/2001 |
| JP | 2002-367994 | 12/2002 |
| WO | WO 02/067319 A2 | 8/2002 |

OTHER PUBLICATIONS

Jung Joo Kim: Method of Fabricating Semiconductor Device; U.S. Appl. No. 11/027,851, filed Dec. 29, 2004; 15 Pages and 2 Drawing Sheets; Assignee; Donghu Anam Semiconductor Inc.

Yoshihiko Toyoda and Takeshi Mori; Semiconductor Device; Patent Abstracts of Japan: Publication No. 2002-367994; Publication Date: Dec. 20, 2002.

Kyoichi Suguro; Semiconductor Device and Manufacturing Method Thereof; Patent Abstracts of Japan; Publication No. 2001-274380; Publication Date: Oct. 5, 2001.

Takuya Kato; Semiconductor Device; Patent Abstracts of Japan; Publication No. 04-127454; Publication Date: Apr. 28, 1992.

* cited by examiner

METHODS OF FABRICATING VIA HOLE AND TRENCH

BACKGROUND OF THE INVENTION

1. Field of the Invention

The present invention relates to a method of fabricating a via hole and a trench and, more particularly, to a method of fabricating a via hole and a trench which removes oxygen of a copper oxide layer by using Hf.

2. Background of the Related Art

FIG. 1 is a cross-sectional view illustrating process of fabricating a via hole and a trench by using a damascene process according to the prior art.

Referring to FIG. 1, a copper interconnect 12 is formed on a substrate 11 on which a predetermined device is formed. After an interlayer dielectric layer 13 is deposited on the copper interconnect 12, it is patterned by using a damascene method to expose some part of the copper interconnect 12. A barrier layer 14, which is made of Ta, TaN or both, is then formed. The reason the barrier layer 14 is made of Ta, TaN or both is that they have a better characteristic than Ti and TiN in terms of the prevention of copper diffusion. The copper interconnect 12 should be cleaned prior to the formation of the barrier layer 14 so as to prevent the formation of impurities such as copper oxide, which results from exposure of the surface of the lower copper layer connected to a via hole to the air. In order to remove the copper oxide which causes high via resistance, dry cleaning by plasma or wet cleaning by etching solutions is conducted. After the deposition of the barrier layer 14, copper filling 15 is carried out. As described above, the prior art has a problem that one additional process of removing copper oxide is required. Moreover, as wet cleaning for removing copper oxides unintentionally damages the interlayer dielectric layer, critical dimension(hereinafter referred to as "CD") of the interlayer dielectric layer is affected, so that step coverage during the barrier layer formation process becomes deteriorated. Furthermore, because the wet cleaning radially etches the copper interconnect itself as well as the copper oxide, much deposition of the barrier layer is necessary, and bottom coverage becomes deteriorated.

SUMMARY OF THE INVENTION

Accordingly, the present invention is directed to a method of fabricating a via hole and a trench that substantially obviates one or more problems due to limitations and disadvantages of the related art.

An object of the present invention is to provide a method of fabricating a via hole and a trench which removes oxygen of a copper oxide layer by using Hf.

To achieve these objects and other advantages and in accordance with the purpose of the invention, as embodied and broadly described herein, a fabricating method of non-volatile memories comprises: forming a via hole and a trench in a interlayer dielectric layer on a semiconductor substrate where a predetermined device is formed; depositing a thin Hf layer on the substrate; performing a thermal treatment of the substrate to getter oxygen and forming a barrier layer; and filling copper into the via hole and the trench.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
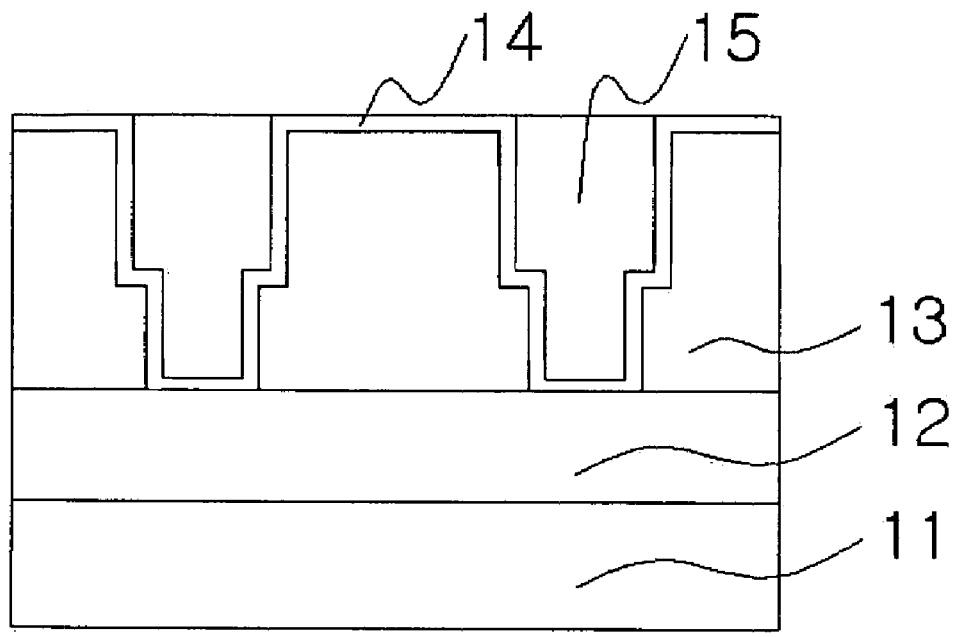
FIG. 1 is a cross-sectional view illustrating processes of fabricating a via hole and a trench by using a damascene process according to the prior art.
Figure 2A:
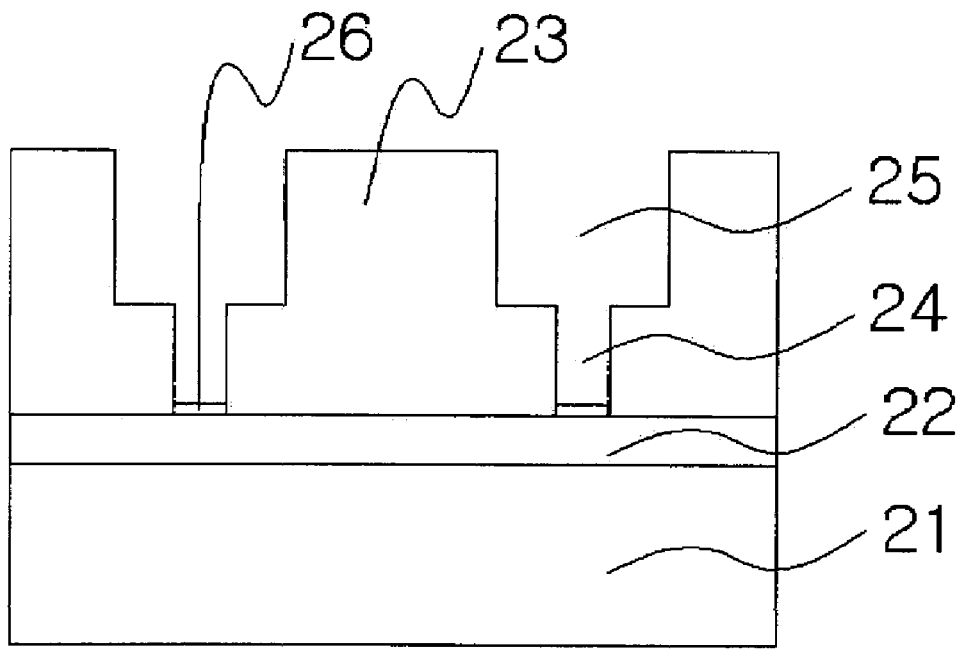
FIGS. 2a through 2d are cross-sectional views illustrating example processes of fabricating a via hole and a trench according to an embodiment of the present invention.

Referring to FIG. 2a, a lower copper interconnect 22 is formed on a substrate 21 where a device is completed. After an interlayer dielectric layer 23 is formed on the lower copper interconnect 22, a via hole 24 and a trench 25 are formed by performing a dual damascene process in the interlayer dielectric layer 23. With this process, copper oxide or a copper oxide layer is created on the lower interconnect exposed to the air.

Figure 2B:
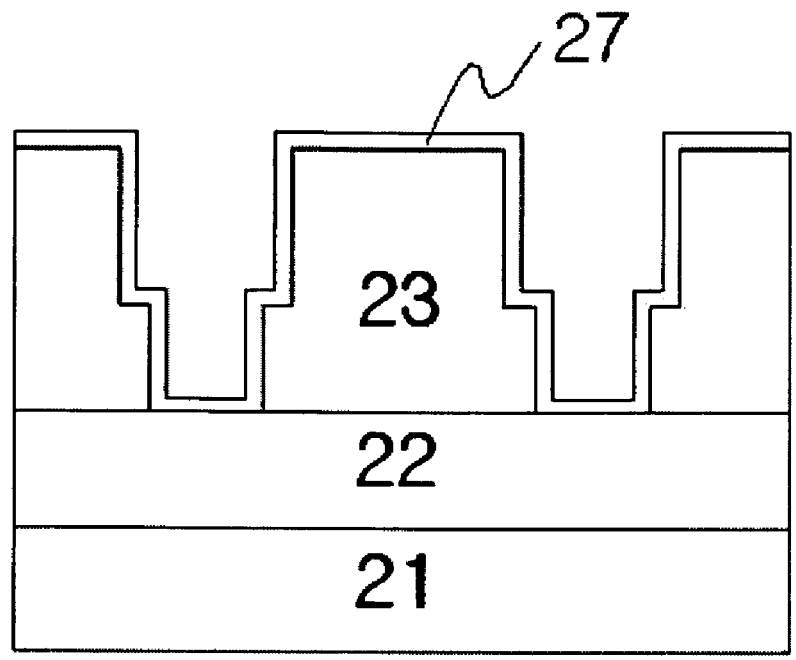

Referring to FIG. 2b, instead of conventional wet cleaning or dry cleaning, a thin Hf layer 27 that serves as a reductant or a reducing agent of copper oxide is deposited through a physical vapor deposition(hereinafter referred to as "PVD") process or a chemical vapor deposition(hereinafter referred to as "CVD") process with a thickness between 50 Å and 500 Å. Because Hf is thermodynamically more stable than copper oxides, it reduces copper oxide to Cu. In detail, Gibbs energy of Hf is −352 kJ/mol at 289K, while that of copper is −169 kJ/mol. Therefore, oxygen of copper oxide made by Cu oxidation reaction is gettered by reduction reaction of a Hf layer or a $HfO_x$ layer, which is deposited on the copper oxides or the copper oxide layer. The $O_2$ gettered by the reduction reaction is introduced or accumulated into the thin Hf layer 27. As no more oxides are made on the copper interconnect, a good characteristic of via resistance is accomplished as well as a trench keeps its original CD, so that an electrical short between neighboring via holes and trenches is prevented.

Figure 2C:
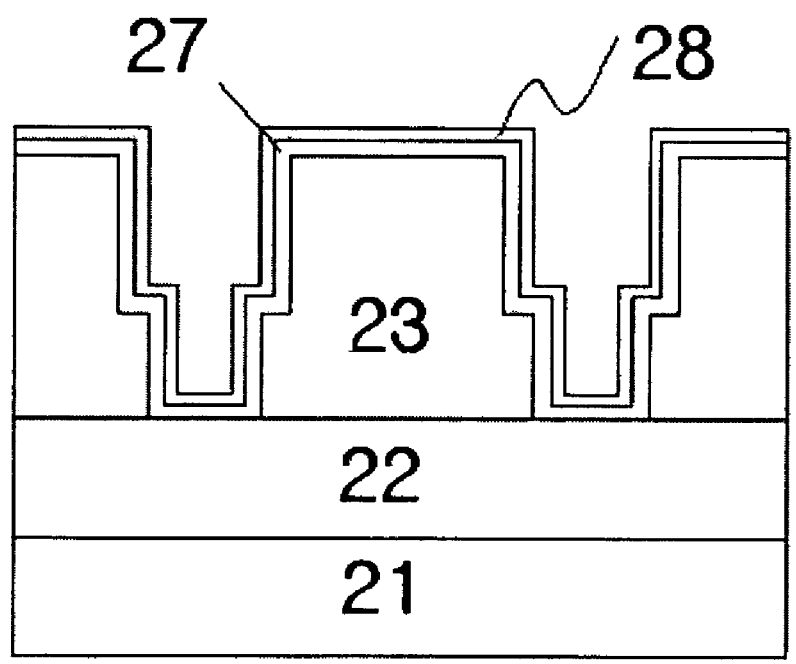

Referring to FIG. 2c, after thermal treatment of the substrate, the oxygen of the copper oxides is gettered and a barrier layer 28 is finally formed on the thin Hf layer. There are several methods for forming the barrier layer 28 as follow. First, after the thin Hf layer is deposited on the copper oxide layer, a rapid thermal processing(hereinafter referred to as "RTP") or furnace thermal treatment for the thin Hf layer is performed to getter oxygen. And a barrier layer 28, which is made of Ti, TiN, Ta, TaN, $WN_x$ or their combination, is formed. Second, after the thin Hf layer is deposited on the copper oxide layer, an RTP(rapid thermal processing) or furnace thermal treatment for the thin Hf layer is performed to build up a $HfN_x$ layer on the thin Hf layer. As the thin Hf layer and the $HfN_x$ layer serve as an adhesion layer and a barrier layer, they getter oxygen through reduction reaction as well as form a barrier layer 28. Third, first, the thin Hf layer is deposited on the copper oxide layer. Thereafter, instead of the thermal treatments described in the first example, a $HfN_x$ layer is deposited on the thin Hf layer in-situ in high vacuum by a PVD process or a CVD process, or ex-situ in other chamber or equipment after vacuum break. After the thermal treatment, the thin Hf layer and the HfN$_x$ layer getter oxygen through reduction reaction as well as form a barrier layer 28. Fourth, when the thin Hf layer is deposited on the copper oxide layer, an ionized PVD method is employed that makes Hf ionized, accelerated and move more straightly. The impact of the ionized Hf provides some energy for activating the reduction of copper oxide, generating an interface between Hf and Cu. Fifth, a preclean RF etch process is carried out before the deposition of the thin Hf layer. The RF etch is minimized to prevent via profile change or distortion caused by Ar$^+$ ions. The thin Hf layer is then deposited. Ar$^+$ ions enhance the reduction capability of the thin Hf layer by activating copper oxide. Thus, the thin Hf layer getters oxygen through reduction reaction as well as forms a barrier layer. The RF etch is performed to the extent that the interlayer dielectric layer is etched with a thickness between 10 Å and 100 Å to minimize a via and trench profile change while the copper oxide is sufficiently activated.

Figure 2D:
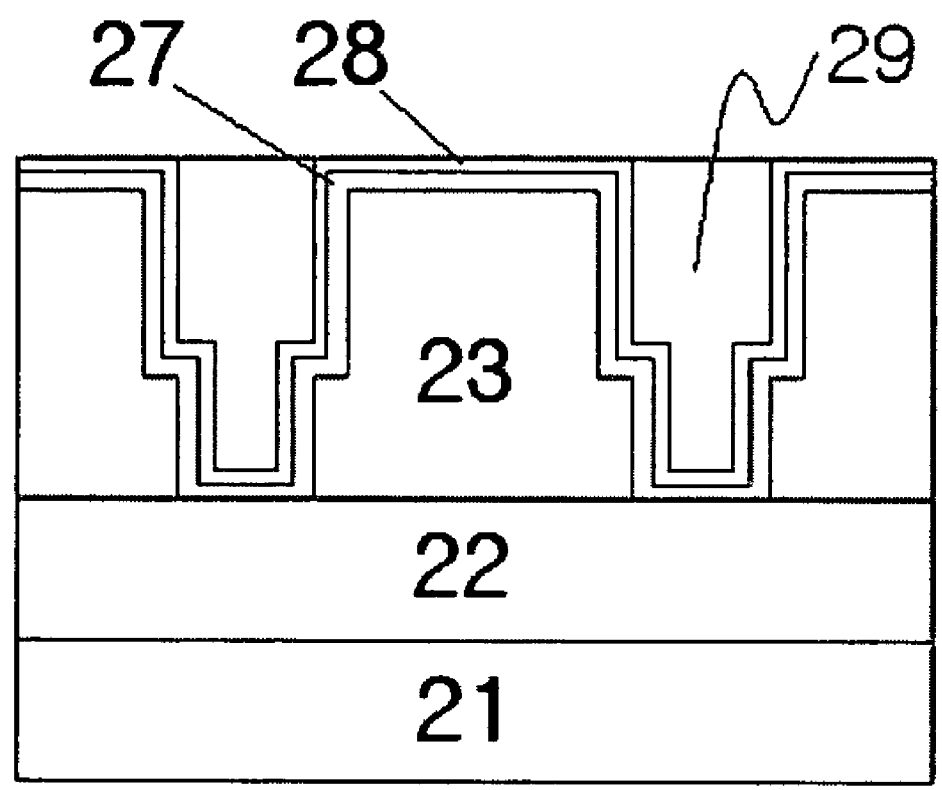

Referring to FIG. 2d, copper is deposited into the via hole and the trench and over the substrate. As a planarization process is carried out on the substrate, a via and a trench 29 made of copper is completed.

Accordingly, the disclosed method fabricates a via hole and a trench by depositing the thin Hf layer to reduce copper oxide instead of using a preclean etch process. Unlike dry cleaning and wet cleaning, the illustrated method prevents CD of the via hole from being extended and solves the problem that the width of a via bottom becomes larger by accumulation of etching solution into a particular region, and easily provides a good step coverage for forming the barrier layer. In addition, because the deposition of the thin Hf layer can be performed by a sputter deposition, a CVD (chemical vapor deposition) process or conventional equipments, the disclosed method doesn't need to use complicated equipments for plasma required in dry cleaning, so that the number of processes and production cost are reduced.

It is noted that this patent claims priority from Korean Patent Application Serial Number 10-2003-0101500, which was field on Dec. 31, 2003, and is hereby incorporated by reference in its entirety.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method comprising:
   forming an interlayer dielectric layer over a lower copper interconnect on a semiconductor substrate where a predetermined device is formed;
   forming a via hole and a trench in said interlayer dielectric layer to expose the lower copper interconnect to air;
   depositing a thin Hf layer on said exposed lower copper interconnect;
   performing a thermal treatment of the substrate to getter oxygen, and forming a barrier layer over the substrate; and
   filling copper into the via hole and the trench.

2. The method as defined by claim 1, wherein the thin Hf layer has a thickness between 50 Å and 500 Å.

3. The method as defined by claim 1, wherein the thermal treatment reduces copper oxide on the lower copper interconnect to form a Cu/Hf interface.

4. The method as defined by claim 1, wherein the thermal treatment comprises an RTP or a furnace thermal treatment and the barrier layer comprises Ti, TiN, Ta, TaN, WN$_x$ or their combination.

5. The method as defined by claim 1, wherein the thermal treatment comprises an RTP or a furnace thermal treatment to build up a HfN$_x$ layer as the barrier layer on the thin Hf layer.

6. The method as defined by claim 1, wherein forming the barrier layer comprises depositing a HfN$_x$ layer on the thin Hf layer in-situ in high vacuum by a PVD process or a CVD process, or ex-situ in another chamber or equipment before performing the thermal treatment.

7. The method as defined by claim 1, wherein depositing the thin Hf layer comprises an ionized PVD that provides some energy for reducing copper oxide formed by exposing the lower copper interconnect to air, thereby generating a Hf/Cu interface.

8. The method as defined by claim 1, further comprising carrying out a preclean RF etch process using Ar$^+$ ions before depositing the thin Hf layer on the substrate.

9. The method as defined by claim 8, wherein the preclean RF etch is carried out to the extent that the interlayer dielectric layer is etched with a thickness between 10 Å and 100 Å.

10. The method as defined by claim 1, wherein the via hole and trench are formed by performing a dual damascene process in the interlayer dielectric layer.

11. The method as defined by claim 10, wherein exposing the lower copper interconnect to the air forms copper oxide or a copper oxide layer.

12. The method as defined by claim 1, wherein said thin Hf layer serves as a reductant of copper oxide.

13. The method as defined by claim 12, wherein said thin Hf layer is deposited by a physical vapor deposition process.

14. The method as defined by claim 12, wherein said thin Hf layer is deposited by a chemical vapor deposition process.

15. The method as defined by claim 1, further comprising carrying out a planarization process after filing copper into the via hole and the trench.

16. The method as defined by claim 1, wherein forming the barrier layer comprises depositing a HfN$_x$ layer on the thin Hf layer.

17. The method as defined by claim 16, wherein the HfN$_x$ layer is deposited in-situ by a PVD process before performing the thermal treatment.

18. The method as defined by claim 16, wherein the HfN$_x$ layer is deposited ex-situ by a CVD process in another chamber or equipment before performing the thermal treatment.

* * * * *